United States Patent [19]
Sawai et al.

[11] Patent Number: 5,165,029
[45] Date of Patent: Nov. 17, 1992

[54] CACHE MEMORY WITH TEST FUNCTION

[75] Inventors: Katsunori Sawai; Akira Yamada, both of Itami, Japan

[73] Assignee: Mitsubishi Denki Kabushiki Kaisha, Tokyo, Japan

[21] Appl. No.: 558,929

[22] Filed: Jul. 27, 1990

[30] Foreign Application Priority Data

Jul. 28, 1989 [JP] Japan .................. 1-197512

[51] Int. Cl.⁵ .............. G06F 12/00; G06F 13/00; G11C 7/00
[52] U.S. Cl. .................... 395/425; 364/DIG. 1; 365/201
[58] Field of Search ............ 365/201; 395/425

[56] References Cited

U.S. PATENT DOCUMENTS 4,464,717  8/1984  Keeley et al. ................ 364/200

Primary Examiner—Alyssa H. Bowler
Attorney, Agent, or Firm—Townsend and Townsend

[57] ABSTRACT

A cache memory, which is provided with means for prohibiting generation of an external bus cycle to read the data to be accessed from a main storage and means for prohibiting update of the content of a tag memory when a cache miss is generated under a test mode of its test function in order to shorten the test time by omitting the process of resetting test patterns in both the tag memory and a data memory.

7 Claims, 17 Drawing Sheets

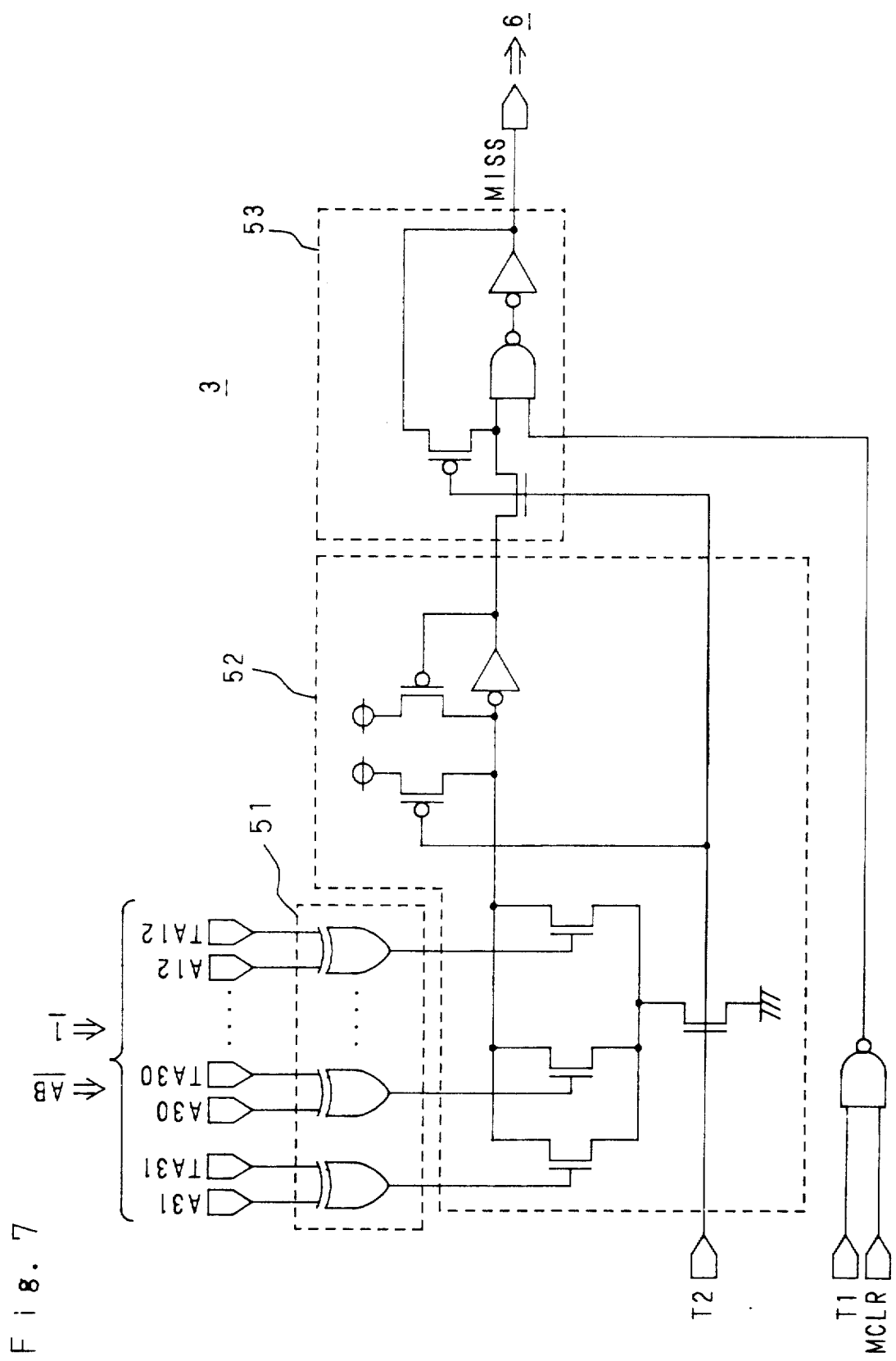

Fig. 12

| a | b | c | d |
|---|---|---|---|
| 0 | 0 | 0 | 1 |
| 0 | 1 | 1 | 0 |
| 1 | 0 | 1 | 1 |
| 1 | 1 | 0 | 0 |

CACHE MEMORY WITH TEST FUNCTION

BACKGROUND OF THE INVENTION

1. Field of the Invention

The present invention relates to a cache memory with a test function, and more particularly to a cache memory which is readily capable of testing a tag memory.

2. Description of Related Art

In a main storage of a computer system, microprocessor system or the like, there are stored an instruction code and data (hereinafter both referred to as data) necessary for operation processing. The data are read from the main storage as necessity requires when an address signal designating an address of the data, which is the location of the data being stored in the main storage, is given to the main storage. Such operation as reading the data from the main storage or writing and storing the data in the main storage is called access.

Incidentally, in the actual operation processing, the data read from the main storage is apt to be local. In other words, when the data was read from the main storage and was used, immediately afterward, this data is likely to be used repeatedly. The main storage has a large capacity, however, it operation speed is low, then, in the case where the main storage is to be accessed every time as necessity requires, it takes longer time for operation processing and this results in reducing the throughput of the whole system. In order to avoid such inconvenience, there has been put into practical use such an arrangement as that the data which was read from the main storage and its address in the main storage are temporarily stored in a memory which has a small capacity but operates at high speed, and such memory is accessed first when the next data is accessed, and in the case where any desired data is not stored in the memory, then the main storage is to be accessed. Such a memory as used on the above occasion is so called a cache memory.

FIG. 1 is a block diagram to illustrate by way of an example construction of such a cache memory as described above, which is disclosed in "Testing the MC 68030 Cache" 1987 ITC (Sept. 1987) pp. 826-833.

In the figure, a tag memory designated by reference numeral 1 stores therein the address, in a main storage (not shown), of the data stored in this cache memory. In this example, the tag memory 1 stores the high order bits A31 through A08 alone in 32 bits of addresses A31 through A00.

Reference numeral 2 designates a data memory which temporarily stores the data which was read from the main storage (not shown). As mentioned above, the high order bits of the address, in the main storage, of the data being stored in this data memory 2 are stored in the tag memory 1.

Reference numeral 3 designates a comparator which compares the high order bits A31 through A08 of the address to be accessed with the address stored in the tag memory 1. In the case where the address coincident with those high order bits A31 through A08 are stored in the tag memory 1, the comparator 3 turns a MISS signal to a low level, and where not, the comparator 3 turns the MISS signal to a high level.

Reference numeral 4 designates a tag memory updating control circuit which updates the content of the tag memory 1 as necessity requires.

Reference numeral 5 designates a transfer gate whose switching is controlled in response to the MISS signal outputted from the above-mentioned comparator 3. In other words, in the case where the compared result by the comparator 3 are coincident with each other, the MISS signal is turned to a low level to switch on the transfer gate 5. On the other hand, where those are not, the MISS signal is turned to a high level to switch off the transfer gate 5.

Reference numeral 70 designates a bus interface control circuit which controls operation of a bus interface circuit 7.

A bit array of an address of the data required to be accessed is schematically shown by reference numeral 8. This bit array consists of 32 bits A31 through A00.

The tag memory 1 is divided into 16 entries, each of which is specified and selected in response to four bits A07 through A04. The address bits A31 through A08 outputted from a CPU (not shown) are stored in this tag memory 1 by control of the tag memory updating control circuit 4 as necessity requires.

The data memory 2 consists of storing units of 64 words (32 bits per word) of 4 words × 16 entries.

For the combination of the address and data to be accessed from an external circuit of the CPU or the like, the tag memory 1 stored the address bits A31 through A08 in its entries which were selected in response to the address signals A07 through A04. In response to the address signals A03, A02, one word is selected from among the four words being included in the selected block.

The whole functional operation of such a cache memory as described above is as follows.

When the CPU (not shown) accesses an instruction code to the main storage, the comparing circuit 3 compares the high order bits (A31-A08) of the address signal outputted from the CPU with the addresses being stored in the tag memory 1.

In the case where the coincident address with those high order bits is stored in the tag memory 1, which is called a cache hit, a word data which was selected in response to the address signals A07 through A04 and A03, A02 is read from the data memory 2 and is outputted to the CPU. In other words, the MISS signal is turned to a low level to switch on the transfer gate 5, and then the data is outputted from the data memory 2 via the transfer gate 5 and the bus interface circuit 7 to a data bus DB.

On the other hand, in the case where the coincident address with those high order bits is not stored in the tag memory 1, which is called a cache miss, the address signals A31 through A08 are stored in the tag memory 1 by control of the tag memory updating control circuit 4, and the word data whose high order 28 bits are coincident with the address of the accessed data is continuously stored in the data memory 2 via the bus interface circuit 7.

Such a tag memory 1 of the conventional cache memory is tested by the following process.

When implementing the most fundamental test of the tag memory 1, the bit pattern whose bits A31 through A08 are all "0" as shown by reference numeral 81 in FIG. 2, for example, is updated in an entry of the tag memory 1, and this bit pattern is tested to decide whether it is a cache hit or cache miss.

To be concrete, the bit pattern 81 coincident with the bit pattern of the updated address is judged to be a cache hit, and then data is outputted from the data memory 2, while it is confirmed that an access cycle to read data from the main storage will not be generated. And each of the bit patterns 82 different, by one bit alone, from the bit pattern of the updated address is judged to be a cache miss, and it is confirmed that an access cycle to fetch data from the main storage to the data memory 2 will be generated.

Furthermore, in the case where a cache miss is judged, the content of the address of the selected entry in the tag memory 1 was updated, then, it is necessary to reset the content of the selected entry in the tag memory 1 every time one cache miss is judged.

The conventional cache memory has thus been constructed, then, when a cache miss occurs, one data consisting of a plurality of words stored in the continuous addresses of the main storage after another is read in the data memory of the cache memory. As a result, the storage capacity of the cache memory itself tends to gradually increase, and when testing the cache memory, there exists a problem that the overhead will be longer when a cache miss is judged.

Furthermore, when the cache miss is judged, the content of the entry of tag memory to be tested is updated, then, it becomes necessary to reset the content of the tag memory every time a series of tests are finished. As a result, it takes longer time for carrying out the tests.

In addition to the above, there is a test method to make the whole content of the tag memory readable, however, this method necessitates a lot of additional circuits for test and more hardware equipment.

SUMMARY OF THE INVENTION

The foregoing problem is solved in accordance with the present invention. And the present invention is directed to provide a cache memory capable of greatly reducing the test time with a minimum additional circuits.

The cache memory of the present invention is provided with a test function, and in addition to this, with means for prohibiting generation of an external bus cycle to read the data to be accessed from a main storage and means for prohibiting update of the content of a tag memory, which is first storage means, when a cache miss occurs under the test mode of the test function.

In the cache memory of the present invention, when a cache miss occurs under the test mode of its test function, both generating the external bus cycle to fetch external data and updating the content of the tag memory, that is, first storage means are prohibited. Accordingly, the test patterns written in both of the tag memory and the data memory, which is second storage means, so as to do the test of the test function are not liable to be updated every time a cache miss is generated, then, it is not necessary to reset the test patterns at every cache miss, accordingly, the test time can be reduced.

The above and further objects and features of the invention will more fully be apparent from the following detailed description with accompanying drawings.

BRIEF DESCRIPTION OF THE DRAWINGS

FIG. 7 is a circuit diagram to illustrate detailed construction of a comparing circuit of the cache memory of the present invention;

FIG. 12 is a truth table of address translation by an address translation circuit of the address latch;

DESCRIPTION OF THE PREFERRED EMBODIMENT

Now will be described below embodiment of the present invention in detail with reference to the accompanying drawings.

Figure 1:
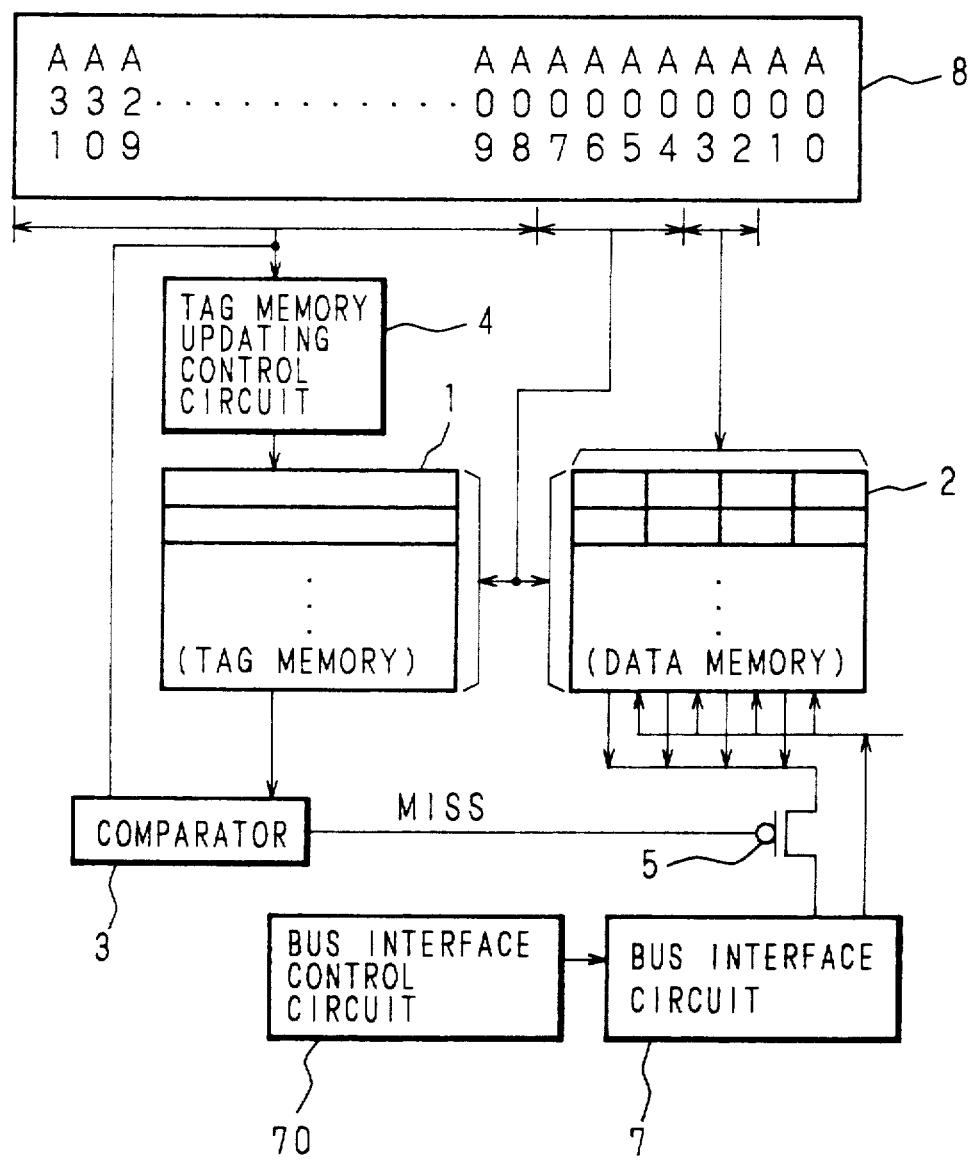
FIG. 1 is a block diagram to illustrate by way of example construction of a conventional cache memory.
Figure 2:
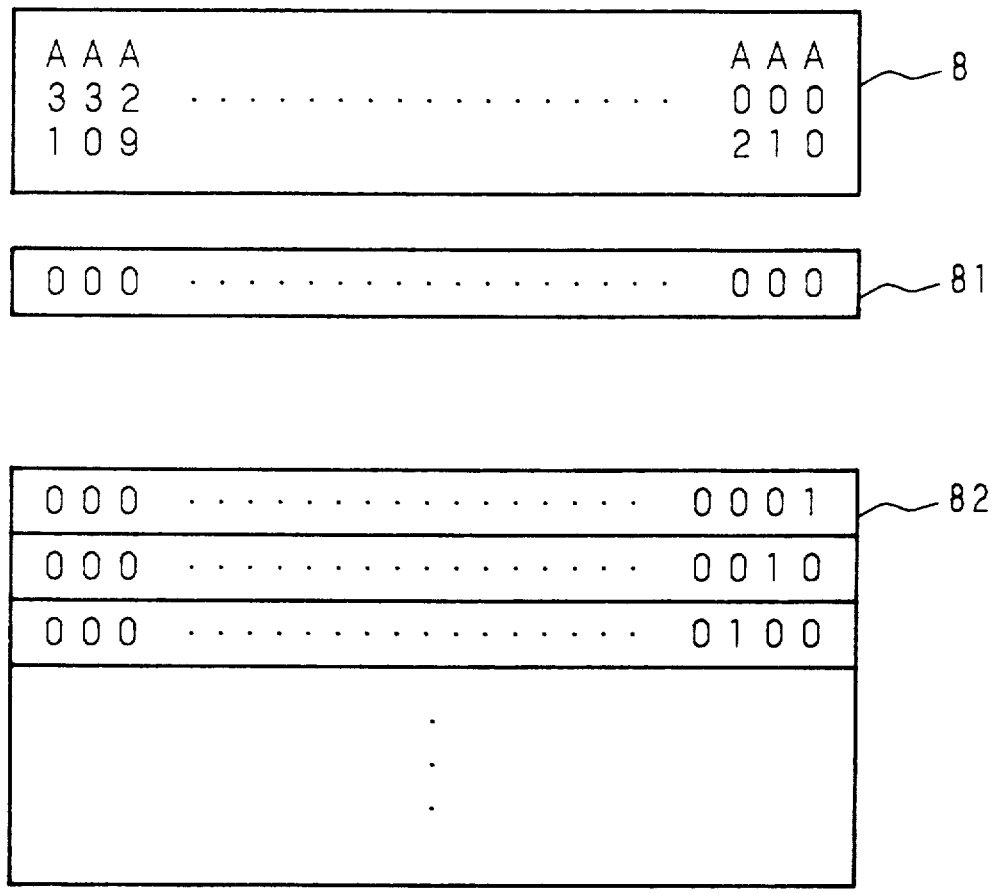
FIG. 2 is a schematic view to illustrate a bit array of an address signal of the conventional cache memory.
Figure 3:
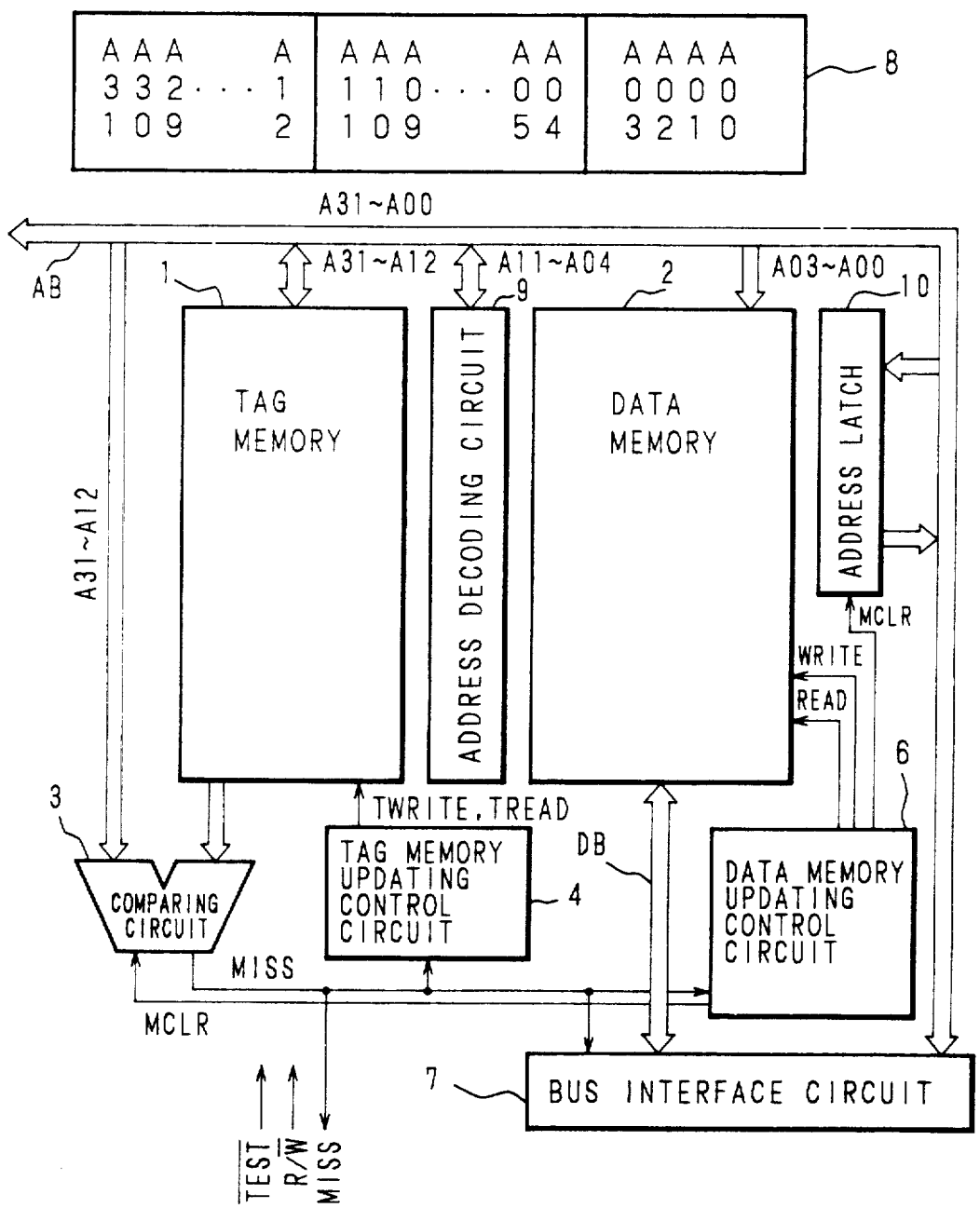
FIG. 3 is a block diagram to illustrate by way of example construction of a cache memory of the present invention.

FIG. 3 is a block diagram to illustrate by way of example construction of a cache memory in accordance with the present invention. In the embodiment of the invention illustrated in FIG. 3, those elements numbered identically with the aforementioned conventional example of FIG. 1 perform the same or similar functions.

In FIG. 3, reference numeral 1 designates a tag memory, which is connected with both of an address bus AB and a comparing circuit 3 so as to receive or transmit data and which receives signals from both of an address decoding circuit 9 and a tag memory updating control circuit 4 as will be referred to later.

As will be described later, the tag memory 1 consists of memory cells of 256 rows×20 columns. The tag memory 1 functions as first storage means for storing therein the address, in a main storage (not shown), of the data stored in the cache memory, to be more concrete, in a data memory 2. In this embodiment, however, the tag memory 1 stores 20 high order bits (A31-A12) alone in 32 bits (A31-A00) as shown by reference numeral 83.

Reference numeral 2 designates a data memory, which is connected with both of the address bus AB and a data bus DB so as to receive and transmit data and which receives signals from both of the address decoding circuit 9 and a data memory updating control circuit 6 as will be described later.

As will be described later, the data memory 2 consists of four memory planes, each of which consists of memory cells of 256 rows ×32 columns.

The data memory 2 functions as second storage means for temporarily stores the data which was read from the main storage (not shown). The high order bits of the address, in the main storage, of the data stored in this data memory 2 are stored in the tag memory 1 as mentioned above.

As mentioned above, reference numeral 3 designates a comparing circuit, which compares the high order bits A31 through A12 of the address signal to be accessed which were given from the address but AB with the addresses being stored in the tag memory 1. In the case where the tag memory 1 stores the address coincident with those high order bits of the address signal given from the address bus AB, which is called a cache hit, the comparing circuit 3 turns a MISS signal to a low level, and where not, which is called a cache miss, the comparing circuit 3 turns the MISS signal to a high level.

Reference numeral 4 designates a tag memory updating control circuit, which functions as first storage means updating means for updating the content of the tag memory 1 as necessity requires. In other words, in the case where the MISS signal outputted from the comparing circuit 3 is at a high level (when cache miss), the tag memory updating control circuit 4 turns its output signal, that is, a TWRITE signal to a high level and gives to the tag memory 1 in order to update the content of the tag memory 1.

Reference numeral 6 designates a data memory updating control circuit, which receives the MISS signal which was outputted from the comparing circuit 3. The data memory updating control circuit 6 functions as second storage means updating means for updating the content of the data memory 2 when the MISS signal is at a high level, that is, when a cache miss occurs. Then, the data memory updating control circuit 6 outputs both of a READ signal and a WRITE signal to the data memory 2, a MCLR signal to the comparing circuit 3, and a MCLR signal and the like to an address latch 10, respectively.

Reference numeral 7 designates a bus interface circuit, which is connected with both of the address bus AB and the data bus DB and which receives the MISS signal outputted from the comparing circuit 3.

Reference numeral 9 designates an address decoding circuit which is connected with the address bus AB to receive the address signals A11 through A04. And this address decoding circuit 9 decodes those address signals A11 through A04 and sends their decoded results to both the tag memory 1 and data memory 2.

Reference numeral 10 designates an address latch, which latches address signals outputted from the address bus AB.

Reference numeral 83 schematically shows a bit array of address signals of the data required to be accessed. This bit array of address signals consists of the 32 bits A31 through A00.

Now will be described below general operation of such a cache memory of the present invention as constructed above in FIG. 3. Incidentally, as will be referred to later, the cache memory of the present invention operates in synchronism with non-overlap clocks of four phases T1, T2, T3, and T4.

Those address signals A31 through A00 outputted from an external circuit of a CPU and the like are given to this cache memory via the address bus AB and are latched by the address latch 10.

Address signals A31 through A12 in the address signals A31 through A00 are inputted to both the comparing circuit 3 and a write buffer circuit (See reference numeral 13 in FIG. 5) of tag memory 1.

The address decoding circuit 9 receives address signals A11 through A04 and decodes them. According to those decoded results, one row is selected from among 256 rows in each memory plane of both the tag memory 1 and data memory 2.

Data (address signal) which was read from this selected row in the memory plane of the tag memory 1 is inputted to the comparing circuit 3 and is compared with the address signals A31 through A12 which were inputted from the address bus AB to the comparing circuit 3. And in the case where those compared results are coincident with each other, that is, when a cache hit occurs, the MISS signal as an output signal of the comparing circuit 3 is kept to be a low level, and where not, that is, when a cache miss occurs, the MISS signal is turned to a high level.

In the case where the MISS signal is at a high level, that is, when a cache miss occurs, the tag memory updating control circuit 4 updates the content of the row of the memory plane of the tag memory 1 which was selected in response to the address signals A11 through A04 to be the content of the addresss signals A31 through A12 being outputted to the address bus AB.

In the case where a $\overline{\text{TEST}}$ signal is at a low level, that is, under the test mode, the content of the tag memory 1 will not be updated even while the MISS signal is kept to be at a high level. This will be referred to later in detail.

When a cache miss occurs, the bus interface circuit 7 sequentially reads into the data memory 2 the data, which is stored in an address adjacent to the address in which a cache miss was generated, from among the data stored in the main storage, and updates the content of the areas which are selected in response to the address signals A11 through A04, and A03, A02 in the data memory 2. The data located in an external main storage are read into the data memory 2 by, what is called, a round robin method. To be more concrete, the data is read into the data memory 2 while changing cyclically in order of (A03, A02) as (0, 0)→(0, 1)→(1, 0)→(1, 1)→(0, 0).

In the case where the address signals A03, A02 are (1, 0) when a cache miss occurs, a bus cycle to read the data of 32 bits into the data memory 2 four times is generated while those address signals A03, A02 alone are changing in order of (1, 0)→(1, 1)→(0, 0)→(0, 1) but the address signals A31 through A04 will not change.

In the case where the $\overline{\text{TEST}}$ signal is at a low level, that is, under the test mode, a bus cycle for updating the content of the data memory 2 will not be generated even when the MISS signal is at a high level. This will be referred to later in detail.

Now will be described below more detailed construction of the above each function block.

Figure 4:
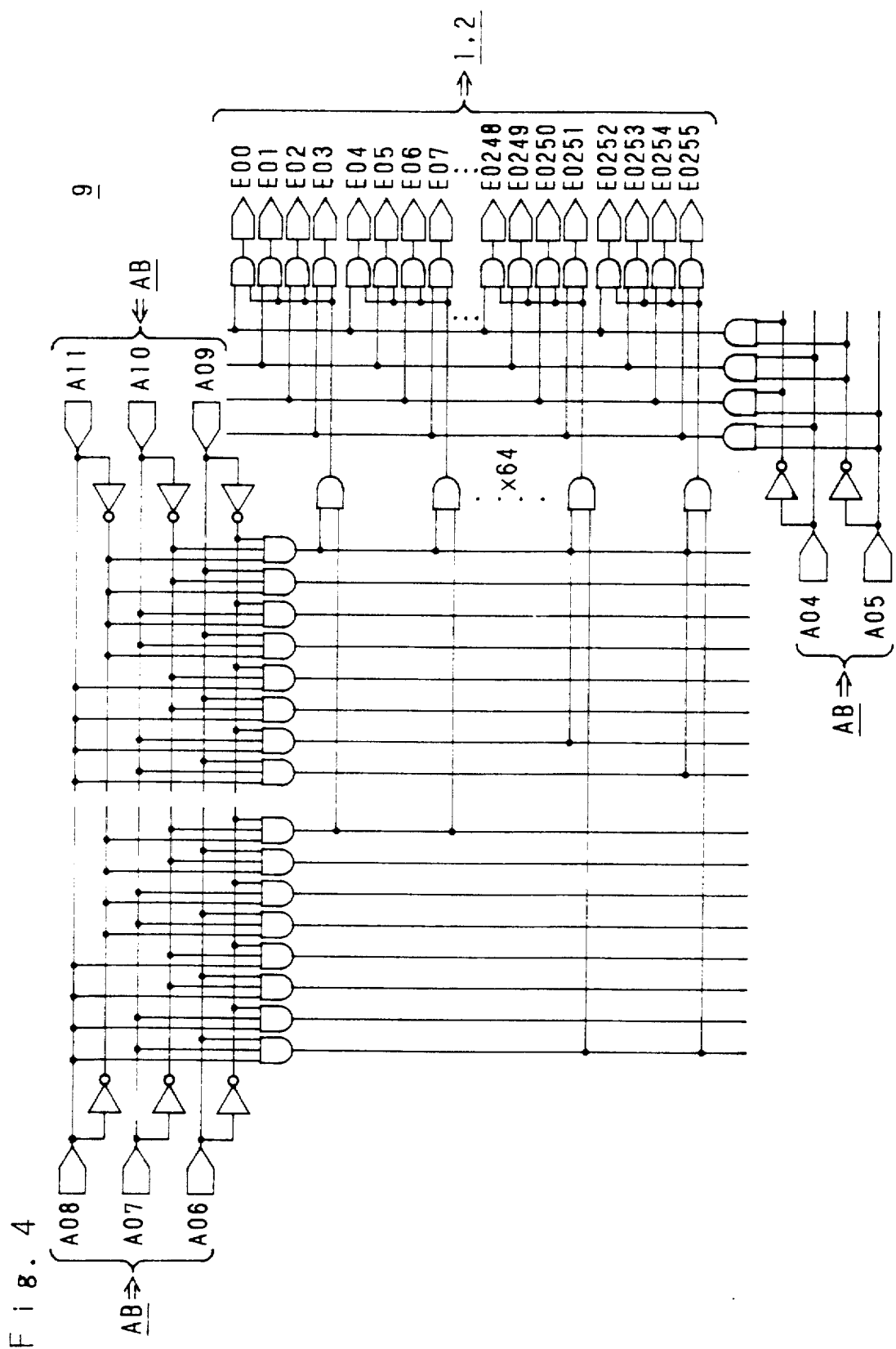
FIG. 4 is a circuit diagram to illustrate detailed construction of an address decoding circuit of the cache memory of the present invention.

FIG. 4 is a circuit diagram to illustrate detailed construction of the address decoding circuit 9.

The address decoding circuit 9, which mainly consists of a lot of AND gates, decodes inputted signals of 8 bits A11 through A04 from among the address signals given from the address bus AB, and then turns one output signal from among 256 output signals EO 0 through EO 255 to a high level. Those output signals EO 0 through EO 255 are given to both the tag memory 1 and the data memory 2.

Figure 5:
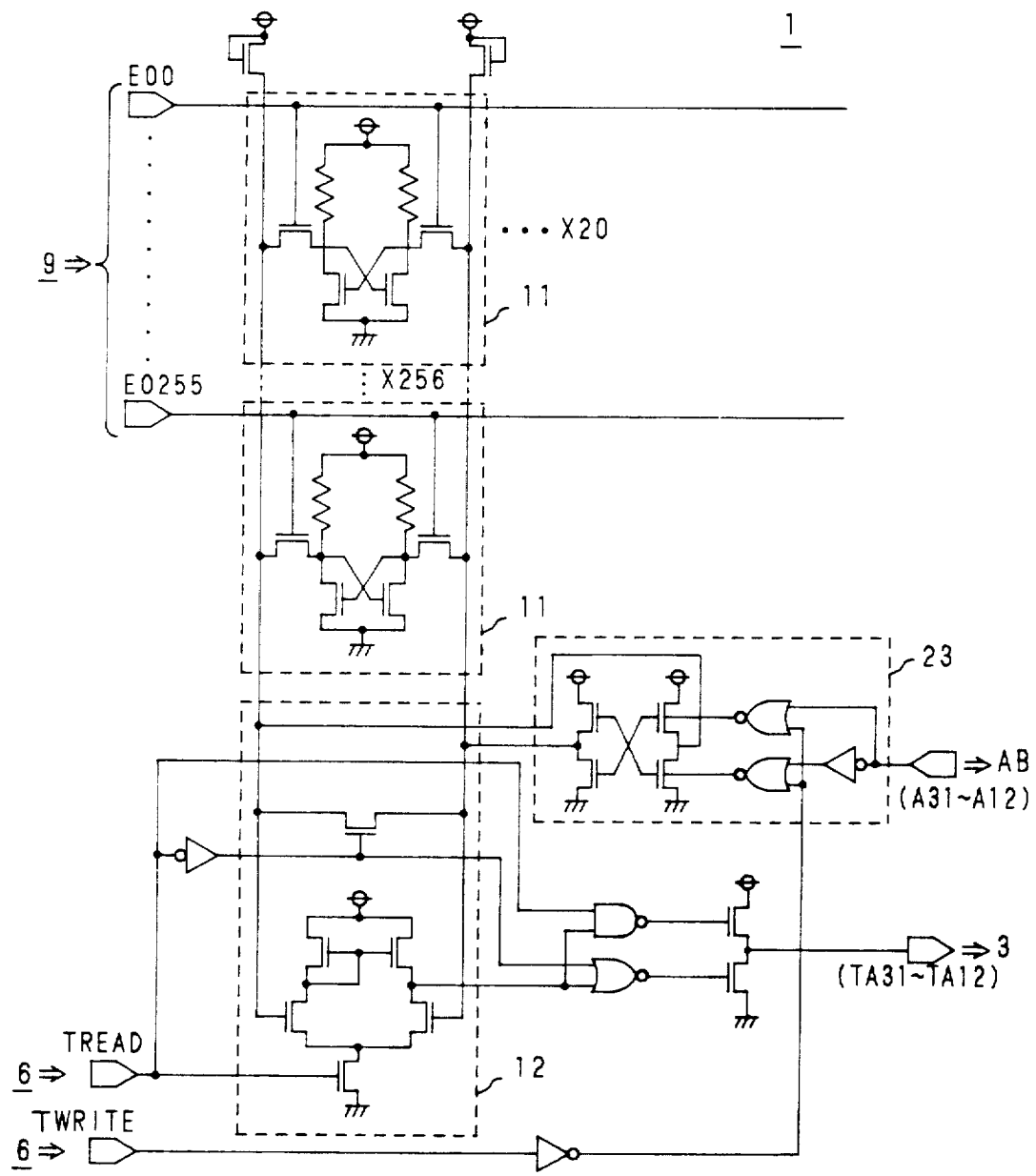
FIG. 5 is a circuit diagram to illustrate detailed construction of a tag memory of the cache memory of the present invention.

FIG. 5 is a circuit diagram to illustrate detailed construction of the tag memory 1.

The tag memory 1 consists of memory cells 11 each consisting of 256 rows ×20 columns, each sense amplifier 12 which outputs signals TA 31 through TA 12 to the comparing circuit 3, each write buffer circuit 13 which receives those address signals A31 through A12 inputted from the address bus AB, and the like.

In FIG. 5, there is shown construction of one column of the tag memory 1, in which the 256 pieces of memory cell 11, the write buffer circuit 13 to which signals A13 are inputted, and the sense amplifier 12 from which signals TA31 are outputted are included.

When selecting a row in the tag memory 1, one row in 256 rows is selected in response to those output signals EO 0 through EO 255 of the address decoding circuit 9 as mentioned above.

And the content of the memory cell of the row which was selected when a TREAD signal is at a high level is outputted to the comparing circuit 3 as the signals TA 31 (TA 30 through TA 12).

Figure 6:
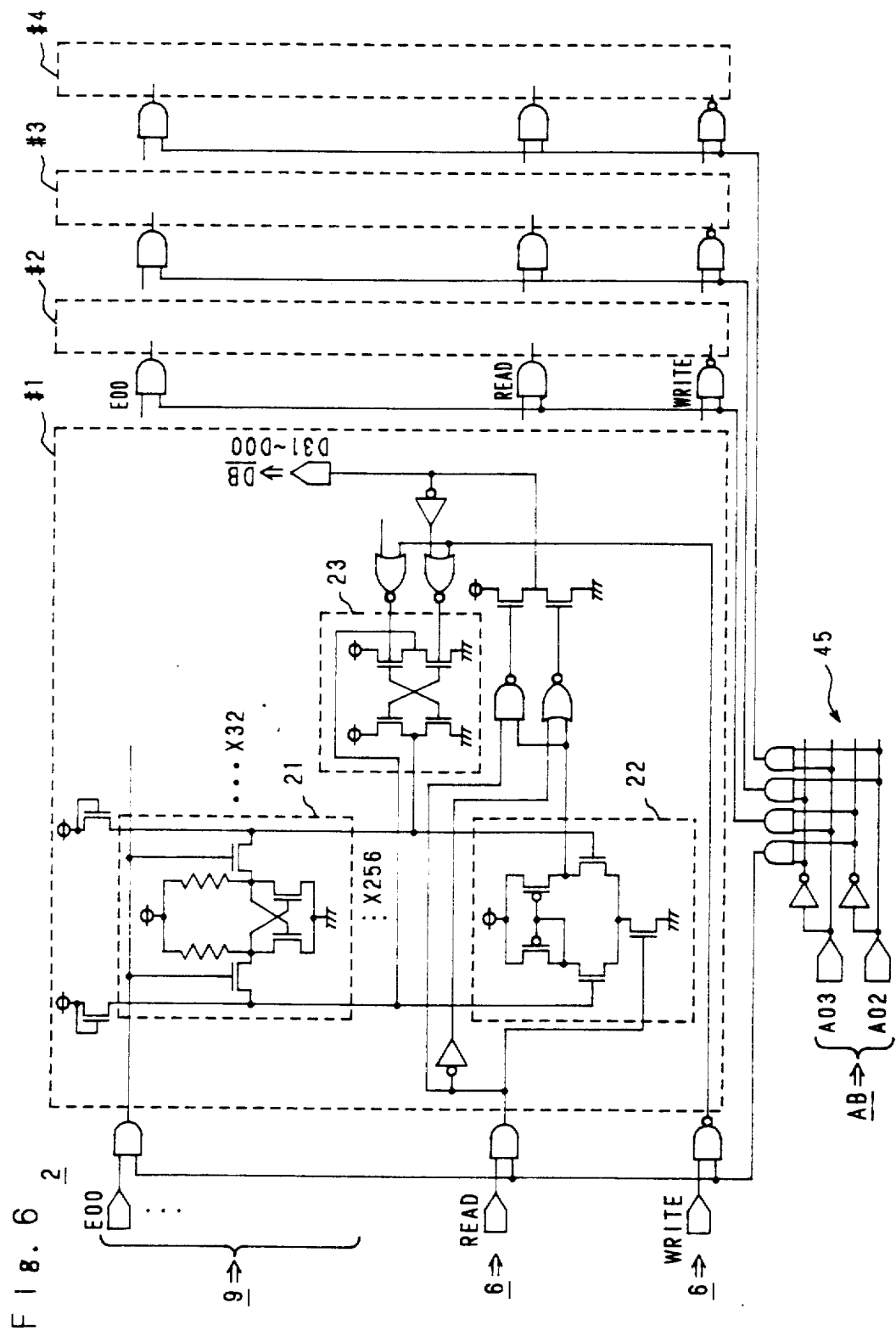
FIG. 6 is a circuit diagram to illustrate detailed construction of a data memory of the cache memory of the present invention.

FIG. 6 is a circuit diagram to illustrate detailed construction of the data memory 2.

The data memory 2 consists of four memory planes #1 through #4, in each of which are arranged memory cells 21 of 256 rows ×32 columns.

One row is selected from among 256 rows of each memory plane #1 through #4 in response to those output signals EO 0 through EO 255 of the address decoding circuit 9, and one memory plane is selected from among the four memory planes #1 through #4 by decoding output of decoding circuit 45 which receives address signals A03, A02, accordingly, one row in one memory plane is to be selected.

Construction of each of those memory planes of the data memory 2 is similar to that of the above tag memory 1 except that its number of columns is increased to 32, then, it consists of each memory cell 21 consisting of 256 rows ×32 columns, each sense amplifier 22, each write buffer circuit 23 and the like.

In FIG. 6, there is shown construction of one column of one memory plane of the data memory 2, in which the 256 pieces of memory cell 21 and the write buffer circuit 23 to which signal D31 is inputted and the sense amplifier 2 from which the signal D31 is outputted are included.

In the case where a READ signal outputted from the data memory updating control circuit 6 is at a high level, as data signals D31 through D00, there is outputted to the data bus DB the content of the memory cell of the row, which was selected in response to those output signals EO 0 through EO 255 of the address decoding circuit 9, in the memory plane which was selected in response to the address signals A03, A02.

In the case where a WRITE signal outputted from the data memory updating control circuit 6 is at a high level, those data signals D31 through D00 which were read from the data bus DB are written and stored in the selected row.

FIG. 7 is a circuit diagram to illustrate detailed construction of the comparing circuit 3.

For the address signals A31 through A12 and the output signals TA31 through TA12 of tag memory 1 both inputted to this comparing circuit 3, an EXOR gate group 51 compares each corresponding number' bits of both signals, such as A31 to TA31, A30 to TA30 . . ., and A12 to TA12. Those compared results are inputted to a clocked NOR circuit 52.

Only where all of those results compared by the EXOR gate group 51 are coincident, a high-level signal is latched by a latch circuit 53 in synchronism with a clock T2. The output signal of the latch circuit 53 is the MISS signal.

Incidentally, the latch circuit 53 is reset in syncronism with a clock T1 where a MCLR signal outputted from the data memory updating control circuit 6 thereto is at a high level.

Figure 8A:
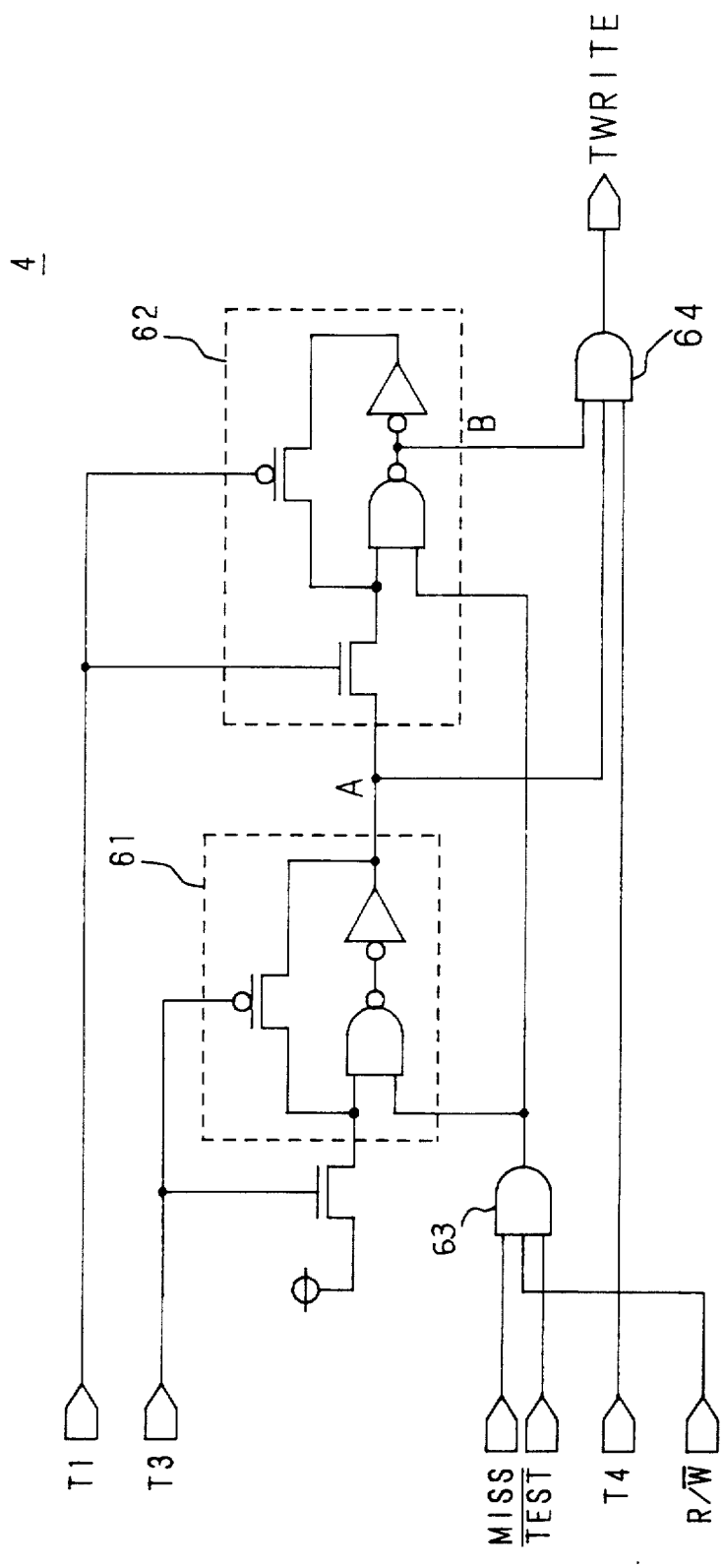
FIG. 8(a) is a circuit diagram to illustrate detailed construction of a portion to generate a TWRITE signal of a tag memory updating control circuit of the cache memory of the present invention.
Figure 8B:
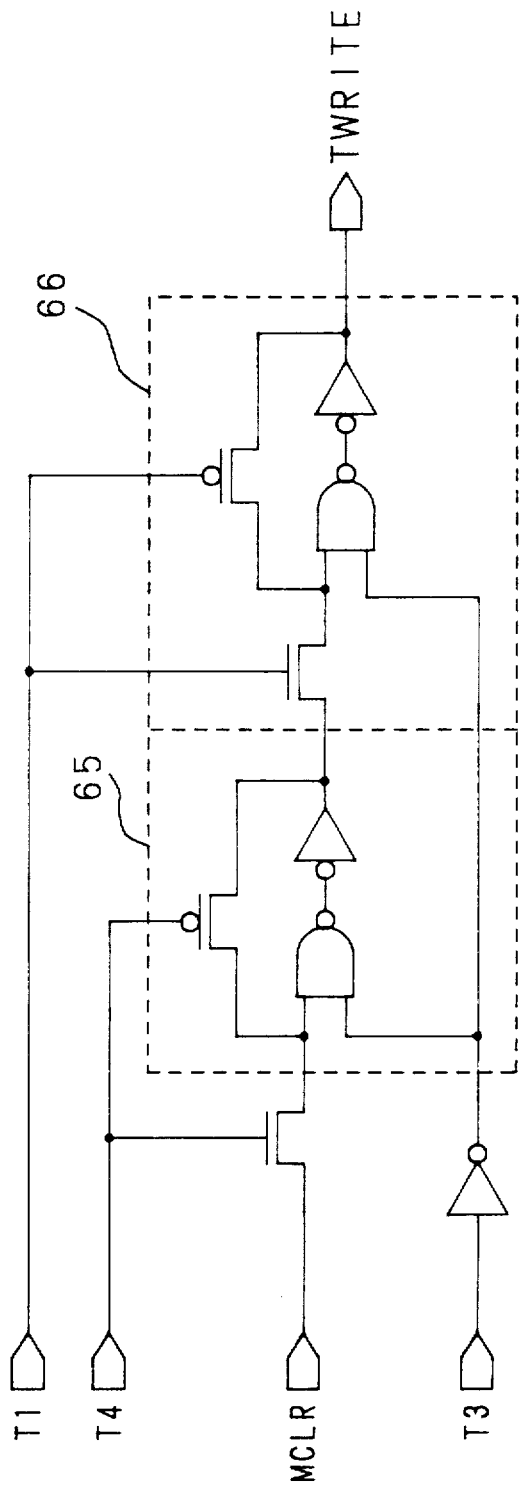
FIG. 8(b) is a circuit diagram to illustrate detailed construction of a portion to generate a TREAD signal of the tag memory updating control circuit of the cache memory of the present invention.
Figure 9:
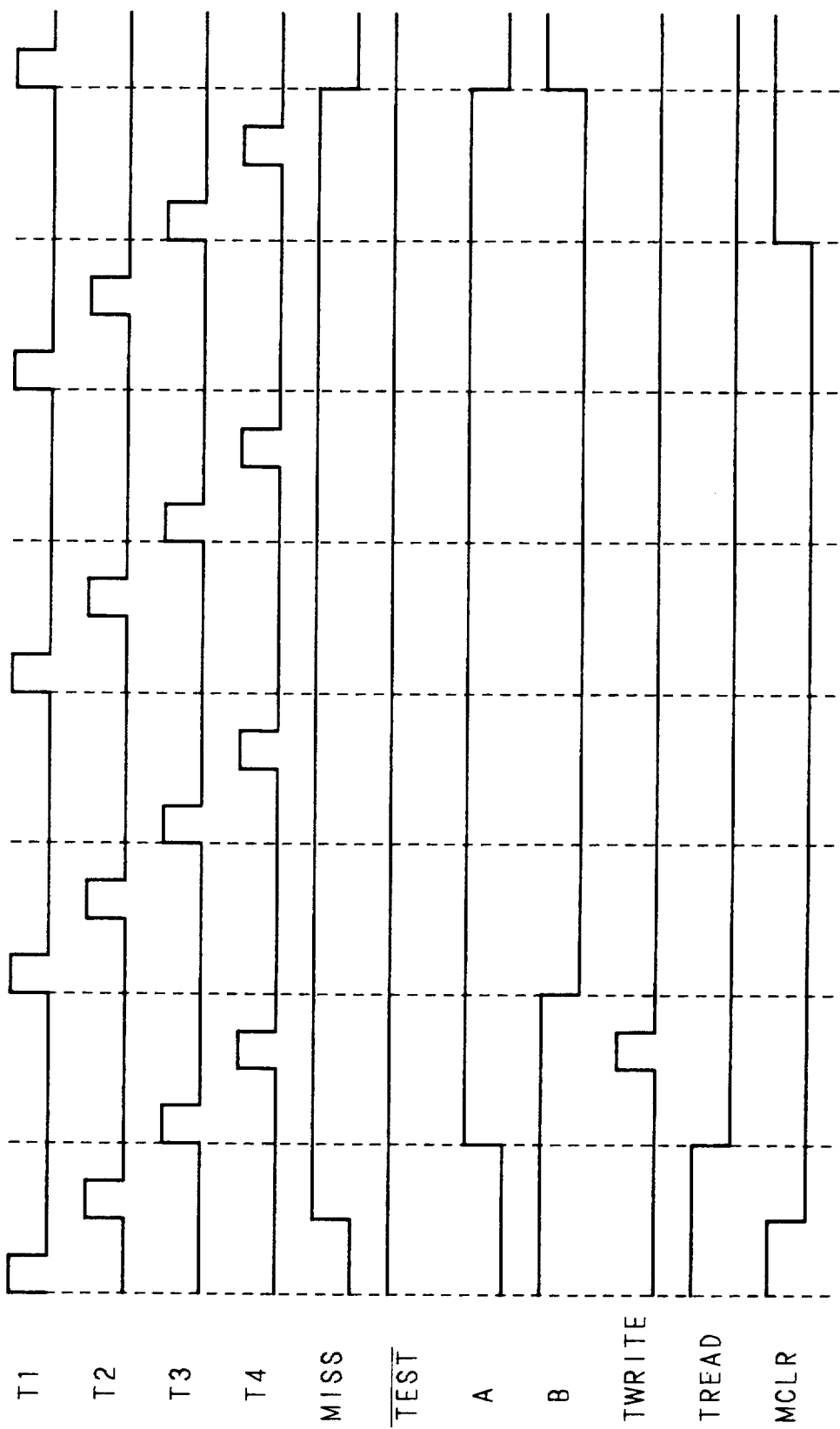
FIG. 9 is a timing chart to explain operation of the tag memory updating control circuit.

FIG. 8(a) and FIG. 8(b) are circuit diagrams to illustrate detailed construction of the tag memory updating control circuit 4, and FIG. 9 is a timing chart to explain it functional operation. FIG. 8(a) shows a portion to generate a TWRITE signal in the tag memory updating control circuit 4, so does FIG. 8(b) a portion to generate a TREAD signal.

A R/$\overline{W}$ signal is a signal to show whether either reading operation or writing operation is in progress. The tag memory 1 is to be updated only when a cache miss is generated in the reading operation, then, intersection (logical product) of this R/$\overline{W}$ signal and the MISS signal is adapted to be inputted to an AND gate 63. The $\overline{TEST}$ signal is also inputted to this AND gate 63, which will be described later.

An output signal of the AND gate 63 is given to both latch circuits 61 and 62 which are in cascade connection. The latch circuit 61 latches the output signal of the AND gate 63 in synchronism with a clock T3, so does the latch circuit 62 in synchronism with the clock T1. The output signals of the latch circuits 61 and 62 are to be inputted to an AND gate 64, in addition, a clock T4 is inputted to this AND gate 64. The output signal of the AND gate 64 is the TWRITE signal.

In the case where the $\overline{TEST}$ signal is at a high level, the latch circuit 61 is set to be at a high level in synchronism with the clock T3. In the case where the MISS signal is at a low level (when cache hit), a node A (output of latch circuit 61) turns to a low level and a node B (output of latch circuit 62) turns to a high level, respectively, and the TWRITE signal as the output signal of the AND gate 64 is kept to be at a low level. In the case where the MISS signal is at a high level (when cache miss), both of the nodes A and B change as shown in FIG. 9, and an intersection (a logical product) signal of the nodes A, B and the clock T4 is outputted from the AND gate 64 as the TWRITE signal. In other words, the TWRITE signal is outputted just once as a high-level pulse signal in synchronism with the clock T4 after the MISS signal was turned to a high level in synchronism with the clock T2.

On the other hand, in the case where the $\overline{TEST}$ signal is at a low level, that is, under the test mode, the output signal of the AND gate 63 is fixed to be at a low level, then, irrespective of the levels of the MISS signal, the node A is fixed to be at a low level and the node B is fixed to be at a high level. As a result, the TWRITE signal is fixed to be at a low level. In other words, under the test mode, updating the content of the tag memory 1 is prohibited by operation of the latch circuits 61, 62.

While, the portion to generate the TREAD signal allows a latch circuit 65, which is synchronous with the clocks T4, T3, to be in cascade connection with a latch circuit 66, which is synchronous with the clocks T1, T3, so as to input the MCLR signal to the latch circuit 65.

During the MCLR signal is being at a high level, the TREAD signal turns to be at a high level in synchronism with a rise of the clock T1, and then turns to be at a low level in synchronism with a rise of the clock T3, which are irrespective of the levels of the TEST signal.

Figure 10:
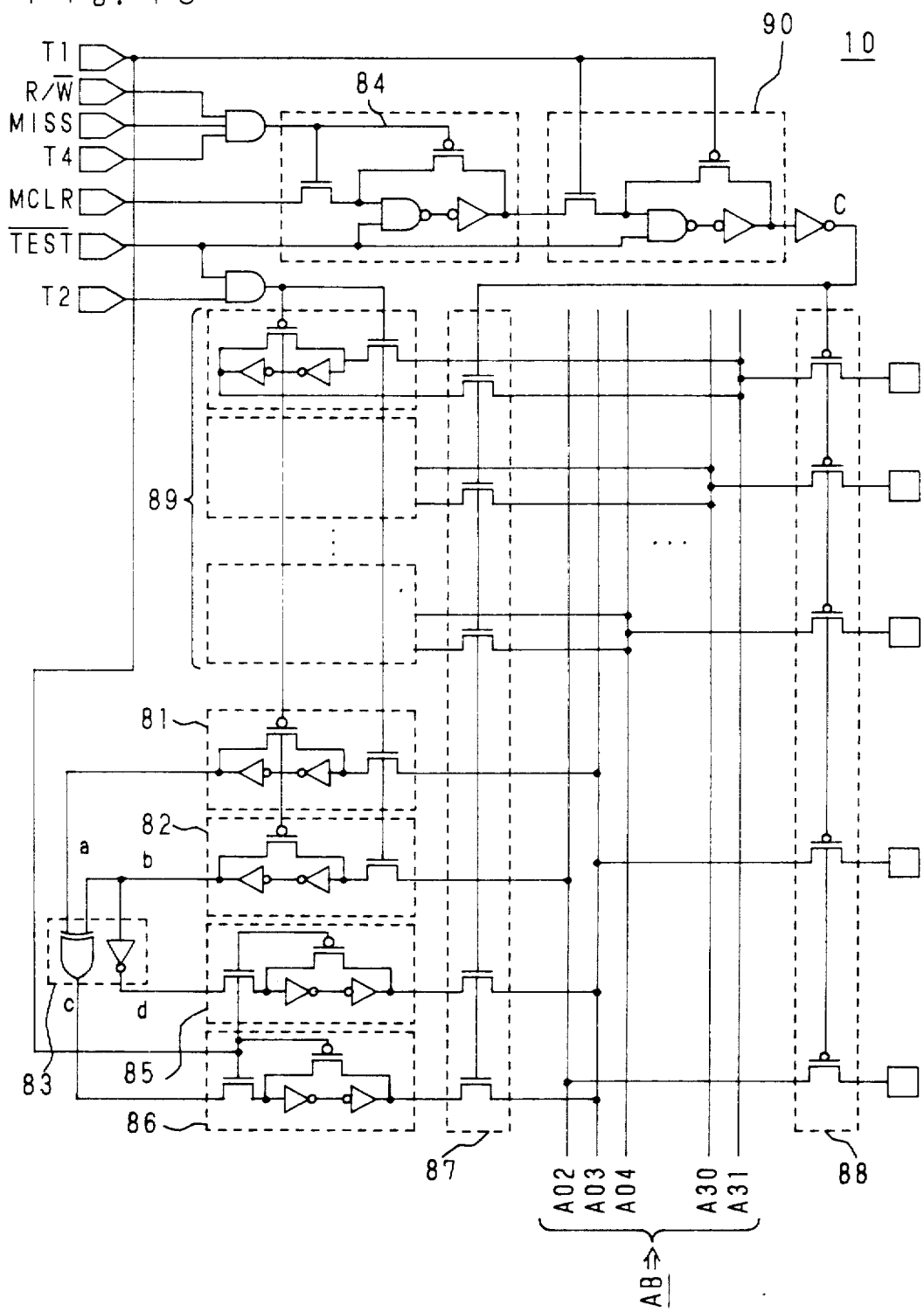
FIG. 10 is a circuit diagram to illustrate detailed construction of an address latch of the cache memory of the present invention.
Figure 11:
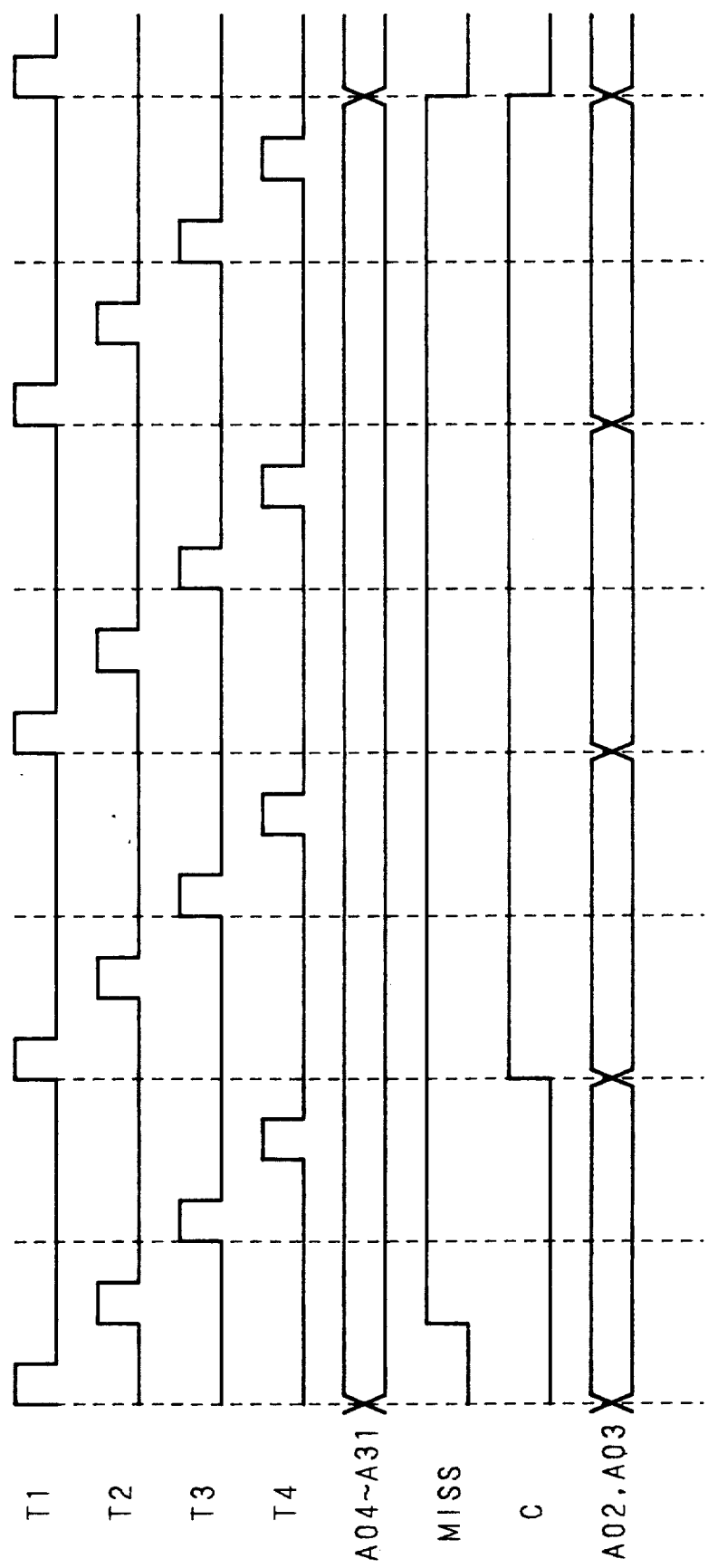
FIG. 11 is a timing chart to explain operation of the address latch.

FIG. 10 is a circuit diagram to illustrate detailed construction of the address latch 10, and FIG. 11 is a timing chart to explain its functional operation.

Reference numeral 89 designates a latch circuit group which consists of latch circuits each of which is corresponding to each of the address signals A31 through A04, and reference numeals 81, 82 designate latch circuits corresponding to the address signals A03, A02, respectively, each of which latches the address signals outputted from the address bus AB in synchronism with the clock T2.

Reference numerals 84, 90 designate address signal selection circuits, which latch the MCLR signal in synchronism with the clock T1, T4, respectively when a cache miss occurs in the reading operation and then output this to a node C.

Assuming that the $\overline{\text{TEST}}$ signal is at a high level and the initial state of the node C is at a low level, the address signal, which is generated from an external circuit of a CPU and the like and is outputted to the address bus AB, is latched by both the latch circuits 81, 82 and the latch circuit group 89 in synchronism with the clock T2. The MCLR signal is latched by the address signal selection circuit 90 at the timing of the clock T1 being one cycle delayed because of change of the MISS signal. As a result, the node C is turned to a high level.

When the node C is turned to a high level, a transistor group 88 is turned off, while a transistor group 87 is turned on. Accordingly, the address signals A31 through A04 are outputted from the latch circuit group 89 to the address bus AB. In addition, the address signals latched by the latch circuits 81 and 82 are inputted to an address translation circuit 83 in synchronism with the clock T2, and these translated addresses are latched by the latch circuits 85 and 86 in synchronism with the clock T1 as well as are outputted to the address bus AB.

Figure 12:
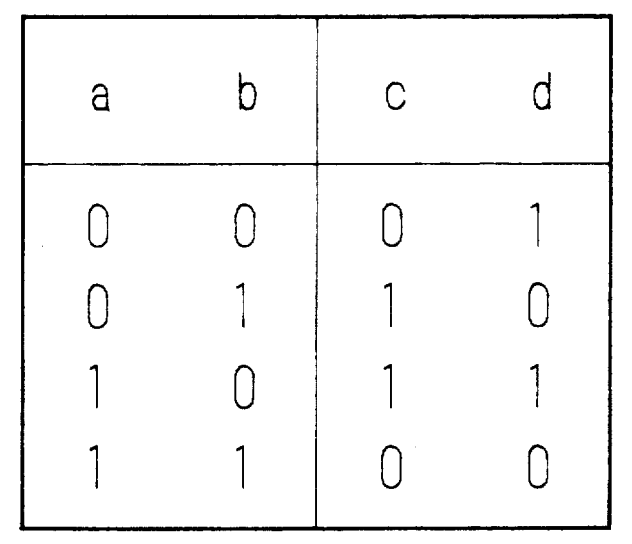

The address translation circuit 83 outputs outputs c, d for inputs a, b according to a truth table shown in FIG. 12.

When a cache miss occurs, in the case where the address signals A03, A02 are (1, 0), the address signals A03, A02 cyclically change in order of (1, 0)→(1, 1)→(0, 0)→(0, 1) to generate the next address by the round robin method.

In the case where the MCLR signal is at a high level, the address signal selection circuit 90 is reset in synchronism with the clock T1 and the node C is turned to be at a low level, that is, to be the initial state.

In the case where the $\overline{\text{TEST}}$ signal is at a low level, that is, under the test mode, irrespective of the levels of the MCLR signal, the state of the address signal selection circuit 90 does not change. Then the address signal generated only by the external circuit will be outputted to the address bus AB, and generating the address signal to access external data is prohibited.

Figure 13:
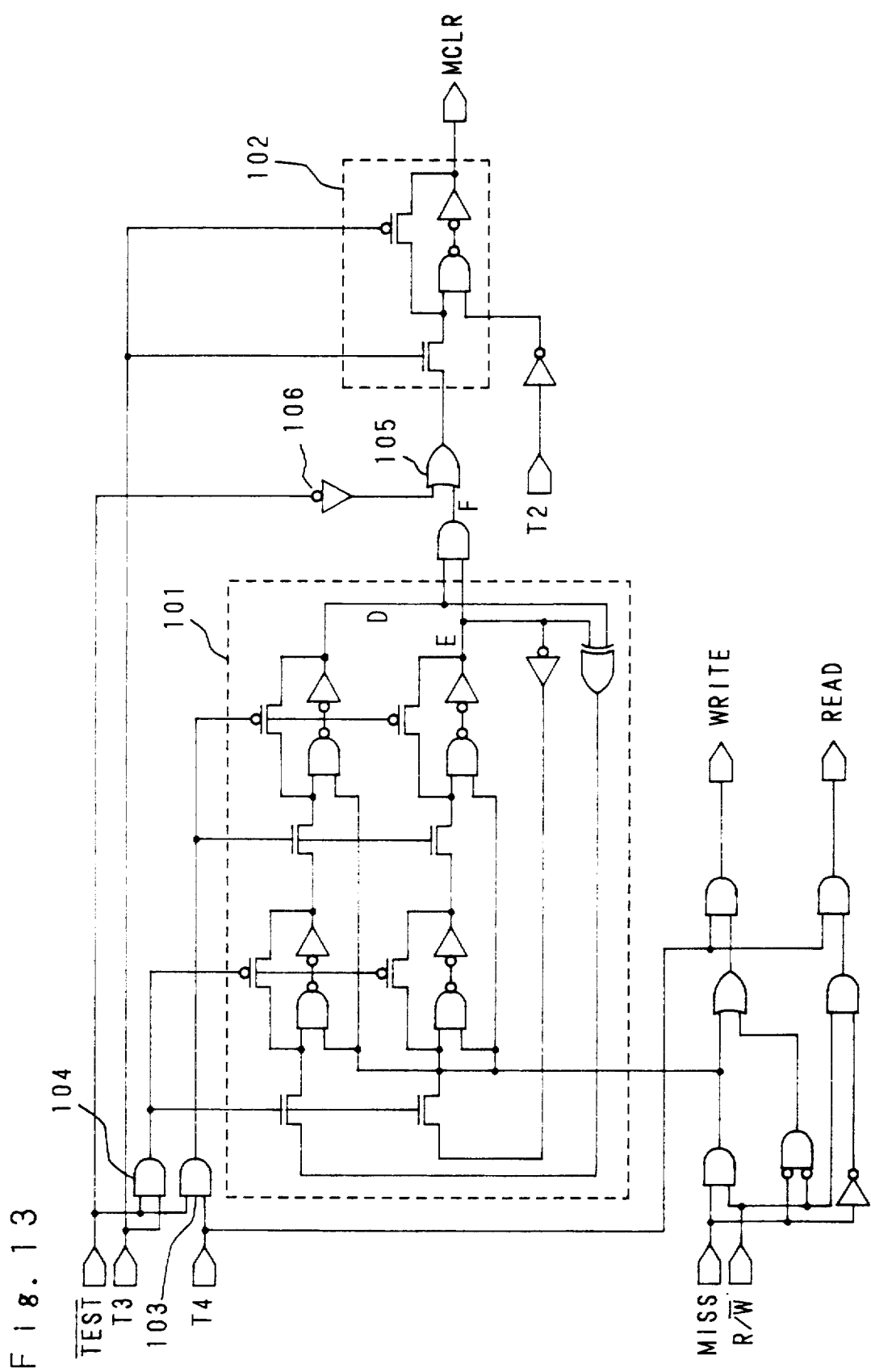
FIG. 13 is a circuit chart to illustrate detailed construction of a data memory updating control circuit of the cache memory of the present invention.
Figure 14:
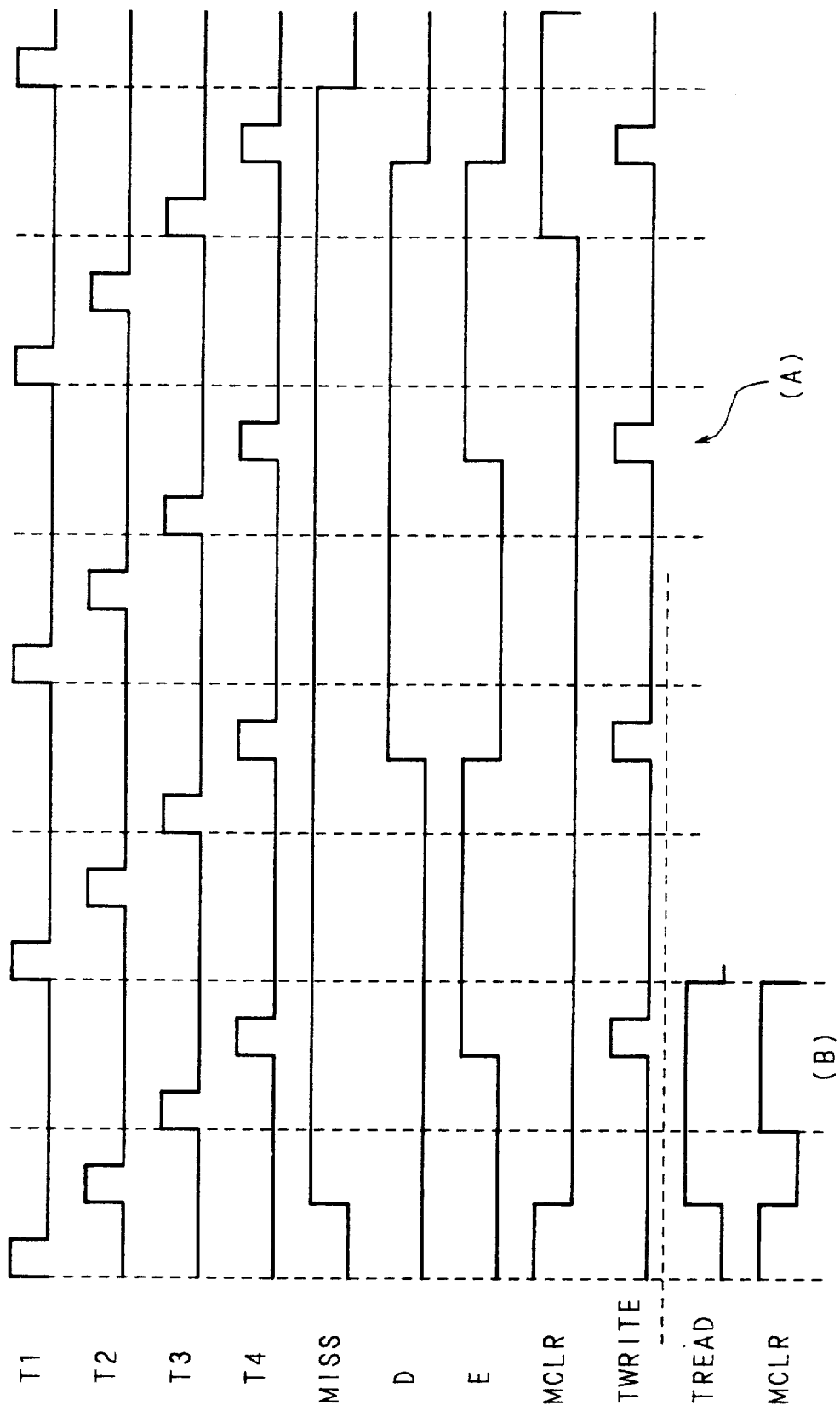
FIG. 14 is a timing chart to explain operation of the data memory updating control circuit.

FIG. 13 is a circuit diagram to illustrate detailed construction of the data memory updating control circuit 6, and fIG. 14 is a timing chart to explain its functional operation.

The data memory updating control circuit 6 generates the MCLR signal for turning the MISS signal, which turns to be at a high level when a cache miss is generated, to be at a low level after a required duration for updating the tag memory 1 and data memory 2 has passed, and both the READ signal and the WRITE signal to be outputted to the data memory 2.

The initial states of the nodes D and E are at a low level, respectively. In the case where the $\overline{\text{TEST}}$ signal is at a high level, a count circuit 101 operates as in the same way as the latch circuits 81, 82, address translation circuit 83, and latch circuits 85, 86 of the address latch 10. However, when the MISS signal turns to a low level, the nodes D and E are initialized to a low level and are always changed in order of (0, 0),→(0, 1)→(1, 0)→(1, 1).

Only where both the nodes D and E are at a high level, a node F becomes a high level and the MCLR signal becomes a high level in synchronism with the clock T3.

In synchronism with the clock T1 after the MCLR signal was turned to be at a high level, the MISS signal is reset to be a low level. The MCLR signal is reset to be a low level at the T2 clock of the same cycle.

In the case where the MISS signal remains at a low level and will not change, the count circuit 101 keeps its initial state and the MCLR signal maintains its low level.

In the case where the $\overline{\text{TEST}}$ signal is at a low level, the clocks T3, T41 inputted to the count circuit 101 are made to be invalid by the AND gates 103 and 104, then, the count circuit 101 keeps its initial state. The node F, however, is fixed to be at a high level by an inverter 106 and an OR gate 105, then, as shown by (B) in FIG. 14, the MCLR signal is turned to be at a high level in synchronism with the clock T3, and the MISS signal is reset.

The bus interface circuit 7 outputs a various of signals to the external circuit at the timing required for receiving and giving data to and from a main storage, CPU, or the like of the external.

To be more concrete, when the MISS signal is at a low level (when cache hit) in the reading operation of data, the bus interface circuit 7 outputs the data being on the data bus DB to the external. In the case where the MISS signal is at a high level (when cache miss), the bus interface circuit 7 outputs the address signal of the data being on the address bus AB to the external, while it outputs the data outputted from the external circuit to the data bus DB.

Figure 15:
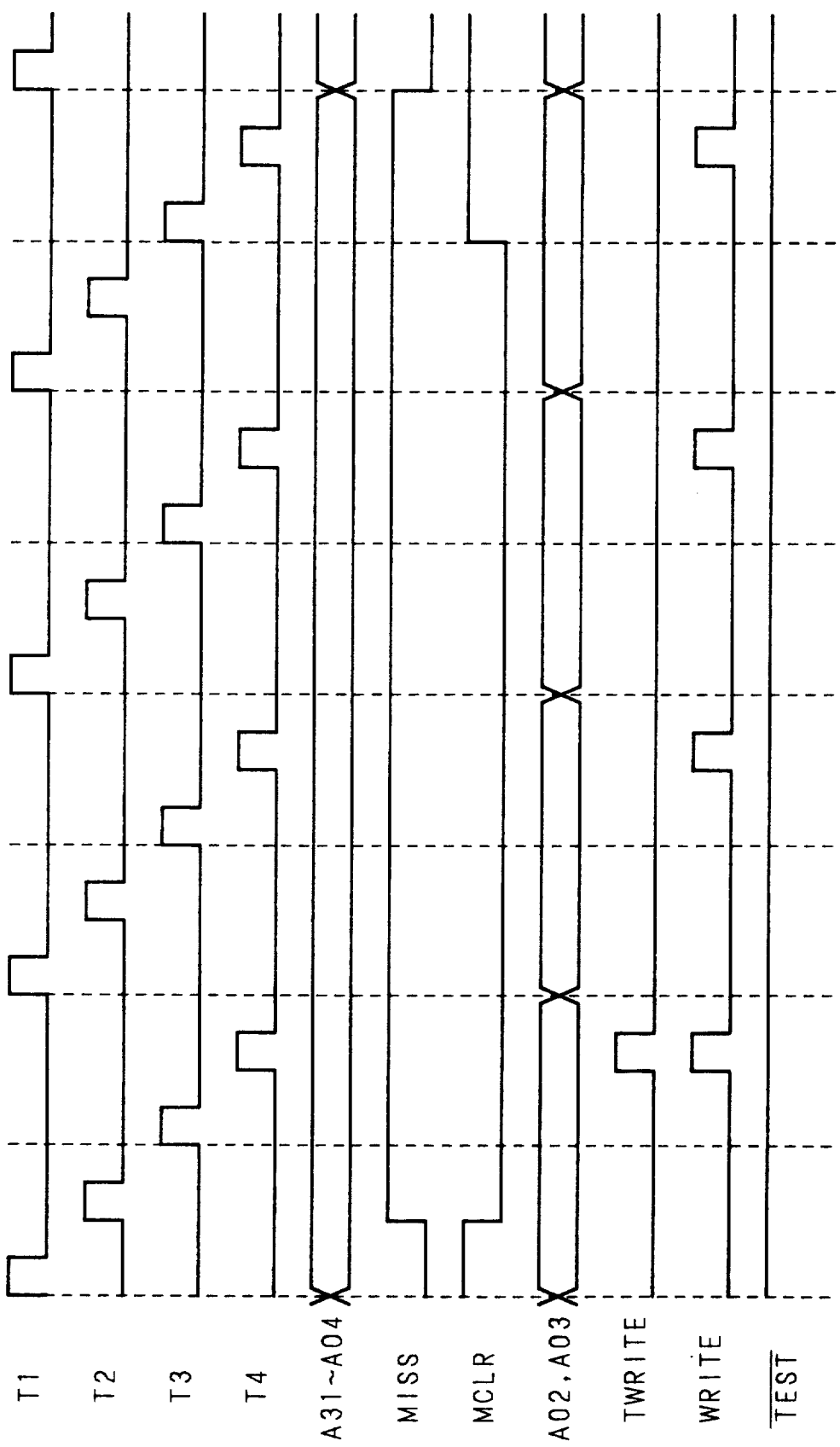
FIG. 15 is a timing chart to illustrate the state of normal operation of the cache memory of the present invention.

FIG. 15 is a timing chart to illustrate the whole state of normal functional operation (not of test mode) of the cache memory of the present invention thus constructed.

In the normal state of the cache memory, when cache miss is generated, the MISS signal is turned from its low level to a high level, and at the same time, the MCLR signal is turned from its high level to a low level. And in synchronism with a rise of the clock T4, both the TWRITE signal and WRITE signal are outputted as high-level pulse signals. As a result, the contents of the tag memory 1 and data memory 2 are updated, and the WRITE signal is generated in synchronism with the clock T4 over the continuing duration of four cycles, then, each of the memory planes #1 through #4 of the data memory 2 is updated, respectively.

Figure 16:
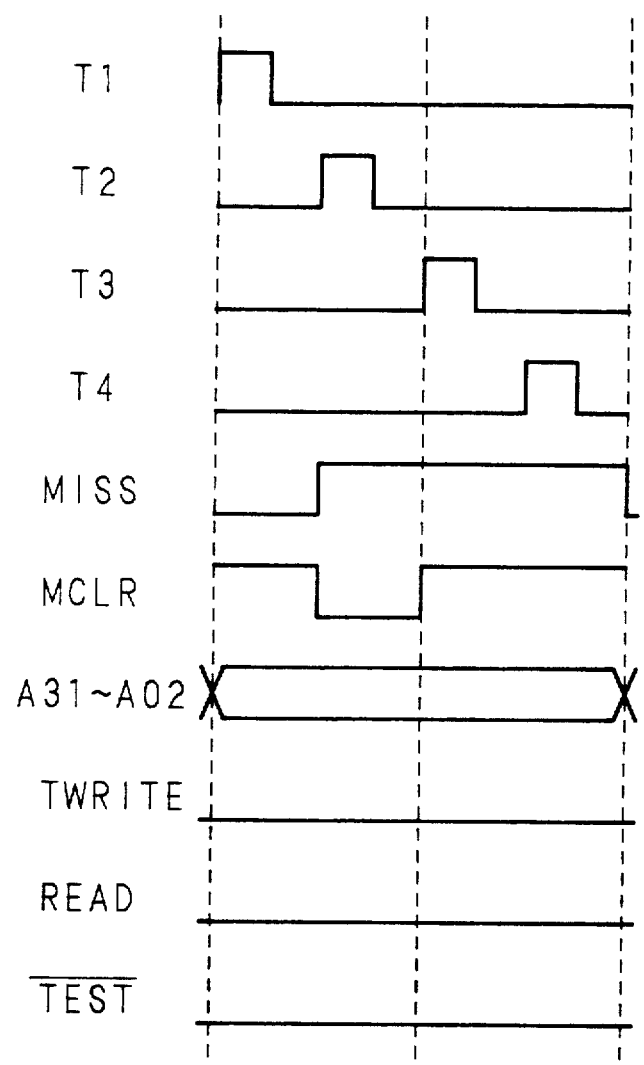
FIG. 16 is a timing chart to illustrate the state of operation of the cache memory of the present invention under the test mode.

FIG. 16 is a timing diagram to illustrate the state of functional operation of the cache memory under the test mode when the $\overline{\text{TEST}}$ signal is at a low level.

As in the same way as mentioned above on detailed construction of the tag memory updating control circuit 4 with reference to FIG. 8(a), in the case where the MISS signal is turned from its low level to a high level, a high-level TWRITE signal is not outputted, in other words, the content of the tag memory 1 is not updated.

As mentioned above on detailed construction of the address latch 10 with reference to FIG. 10, under th test mode of the cache memory when the $\overline{\text{TEST}}$ signal is at a low level, the state of the address signal selection circuit 90 is fixed to the initial state, then, only an address signal generated by the external circuit is outputted to the address bus AB. As a result, a bus cycle to access the main storage is not generated.

In addition, the MCLR signal turns to be a high level in synchronism with a rise of the next clock T3, and then the MISS signal returns to a low level in synchronism with a rise of the next clock T1. In other words, in the case where a cache miss is generated under the normal mode, the external data is fetched into the data memory 2 over a duration of four cycles of the click, while under the test mode, the MISS signal returns to a low level soon in a rise of the next cycle of the clock T1. As a result, the test is immediately to be continued.

As mentioned above in detail, with the cache memory of the present invention, the first invention can shorten the test time of the cache memory because data is not fetched from the external main storage when a cache miss is generated.

And the second invention can also shorten the test time of the cache memory because the content of the tag memory is not liable to be updated and then the time required for resetting a test pattern is to be reduced.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A cache memory comprising:
   first storage means having a plurality of storage areas each of which stores high order bits of an access address to access a main storage;
   second storage means having a plurality of storage areas corresponding to each storage area of said first storage means, each of which stores data outputted from said main storage in response to said access address in the storage area corresponding to the storage area of said first storage means in which high order bits of the access address of the data are stored;
   comparing means for comparing the content of each storage area of said first storage means with an access address of data;
   means, when it is confirmed by said comparing means that the high order bits of the access address coincides with any one of storage areas of said second storage means, for reading data from the storage area of said second storage means corresponding to the storage area of said first storage means;
   first storage means updating means, when it is confirmed by said comparing means that the high order bits of the access address coincides with none of storage areas of said first storage means, for updating the content of the storage area of said first storage means so as to make this coincident with the high order bits of said access address;
   address generating means, when it is confirmed that the high order bits of the access address coincides with none of storage areas of said second storage means by said comparing means, for generating an external bus cycle which successively reads data stored in an address of said main storage whose high order bits are coincident with said access address;
   second storage means updating means for storing the data being read from said main storage in said second storage means; and
   means for prohibiting said address generating means from generating the external bus cycle in response to a predetermined signal.

2. A cache memory as set forth in claim 1, wherein said address generating means is provided with an address latch which latches said access address and an address translation circuit which translates low order bits of the access address latched by said address latch by a round robin method.

3. A cache memory as set forth in claim 2, wherein said means for prohibiting said address generating means from generating the external bus cycle is a circuit which prohibits said address latch from latching the access address in the case where said predetermined signal is given.

4. A cache memory comprising:
   first storage means having a plurality of storage areas each of which stores high order bits of an access address to access a main storage;
   second storage means having a plurality of storage areas corresponding to each storage area of said first storage means, each of which stores data outputted from said main storage in response to said access address in the storage area corresponding to the storage area of said first storage means in which high order bits of the access address of the data is stored;
   comparing means for comparing the content of each storage area of said first storage means with an access address of data;
   means, when it is confirmed by said comparing means that the high order bits of the access address coincides with any one of storage areas of said second storage means, for reading data from the storage area of said second storage means corresponding to the storage area of said first storage means;
   first storage means updating means, when it is confirmed by said comparing means that the high order bits of the access address coincides with none of storage areas of said first storage means, for updating the content of the storage area of said first storage means so as to make this coincident with the high order bits of said access address;
   address generating means, when it is confirmed by said comparing means that the high order bits of the access address coincides with none of storage areas of said second storage means, for generating an external bus cycle which successively reads data stored in an address of said main storage whose high order bits are coincident with said access address;

second storage means updating means for storing the data being read from said main storage in said second storage means; and means for prohibiting said first storage means updating means from updating the content of said first storage means in response to a predetermined signal.

5. A cache memory comprising:

first storage means having a plurality of storage areas each of which stores high order bits of an access address to access a main storage;

second storage means having a plurality of storage areas corresponding to each storage area of said first storage means, each of which stores data outputted from said main storage in response to said access address in the storage area corresponding to the storage area of said first storage means in which high order bits of the access address of the data are stored;

comparing means for comparing the content of each storage area of said first storage means with an access address of data;

means, when it is confirmed by said comparing means that the high order bits of the access address coincides with any one of storage areas of said second storage means, for reading data from the storage area of said second storage means corresponding to the storage area of said first storage means;

first storage means updating means, when it is confirmed by said comparing means that the high order bits of the access address coincides with none of storage areas of said first storage means, for updating the content of the storage area of said first storage means so as to make this coincident with the high order bits of said access address;

address generating means, when it is confirmed by said comparing means that the high order bits of the access address coincides with none of the storage areas of said second storage means, for generating an external bus cycle which successively reads data stored in an address of said main storage whose high order bits are coincident with said access address;

second storage means updating means for storing the data being read from said main storage in said second storage means;

means for prohibiting said address generating means from generating the external bus cycle in the case where a predetermined signal is given; and means for prohibiting said first storage means updating means from updating the content of said first storage means in response to a predetermined signal.

6. A cache memory as set forth in claim 5, wherein said address generating means is provided with an address latch which latches said access address and an address translation circuit which translates low order bits of the access address latched by said address latch by a round robin method.

7. A cache memory as set forth in claim 6, wherein said means for prohibiting the address generating means from generating the external bus cycle is a circuit which prohibits said address latch from latching the access address in the case where said predetermined signal is given.

* * * * *